(12) United States Patent
Lawson

(10) Patent No.: US 8,442,176 B2
(45) Date of Patent: May 14, 2013

(54) COMMA ALIGNMENT WITH SCRAMBLED DATA

(75) Inventor: Matthew Todd Lawson, Grass Valley, CA (US)

(73) Assignee: Cisco Technology, Inc., San Jose, CA (US)

( * ) Notice: Subject to any disclaimer, the term of this patent is extended or adjusted under 35 U.S.C. 154(b) by 645 days.

(21) Appl. No.: 12/696,918

(22) Filed: Jan. 29, 2010

(65) Prior Publication Data

US 2011/0188565 A1  Aug. 4, 2011

(51) Int. Cl.
*H04L 7/00* (2006.01)
(52) U.S. Cl.
USPC ............ 375/368; 375/354; 375/362; 375/365
(58) Field of Classification Search ................... 375/368
See application file for complete search history.

(56) References Cited

U.S. PATENT DOCUMENTS

| | | | | |
|---|---|---|---|---|
| 7,346,819 | B2 * | 3/2008 | Bansal et al. | 714/726 |
| 7,529,275 | B2 * | 5/2009 | Sridharan et al. | 370/514 |
| 2006/0107154 | A1 * | 5/2006 | Bansal et al. | 714/738 |
| 2007/0008991 | A1 * | 1/2007 | Sridharan et al. | 370/474 |

OTHER PUBLICATIONS

Sawyer, Nick, "Word Alignment and SONET/SDH Deframing," XILINX, Application Note: Virtex-II Series, Jun. 18, 2004, pp. 1-5, XAPP652 (v1.0.1), Retreived from the Internet: URL:http://www.xilinx.com/support/documentation/application_notes/xapp652.pdf, [retrieved on Apr. 27, 2011].

Lewis, Dave, "DesignCon 2004—SerDes Architectures and Applications," National Semiconductor Corporation, 2004, 14 pages, Retrieved from the Internet: URL:http://www.national.com/appinfo/lvds/files/designcon2004_serdes.pdf, [retrieved on Apr. 27, 2011].
"Lock Times for the ORT82G5 and ORT42G5 SerDes," Technical Note TN1025, Lattice National Semiconductor Corportion, Apr. 2003, pp. 71-73, Retrieved from the Internet: URL:http://www.latticesemi.com/lit/docs/technotes/tn1025.pdf, [retrieved on Apr. 27, 2011].
"The Evolution of High-Speed Transceiver Technology," Altera White Paper, Nov. 2002, pp. 1-15, ver. 1.0, Retrieved from the Internet: URL:http://www.altera.com/literature/wp/wp_hs_transceiver.pdf, [retrieved on Apr. 27, 2011].
Sorna, M., et al., "A 6.4Gb/s CMOS SerDes Core with Feedforward and Decision-Feedback Equalization," IEEE International Solid-State Circuits Conference, 2005, pp. 62-63 and Contd. on p. 585, vol. 1, IEEE, Piscataway, NJ.
Zhou, Mingzhu, et al., "A 6.25 Gb/s Decision Feedback Equalizer used in SerDes for High-speed Backplane Communications," Microwave and Millimeter Wave Technology, 2007, ICMMT, International AI Conference ON, IEEE, PI.
International Search Report for Application No. PCT/US2011/022414 dated May 10, 2011.

* cited by examiner

*Primary Examiner* — Erin File
(74) *Attorney, Agent, or Firm* — Patterson & Sheridan, LLP

(57) ABSTRACT

Computer-readable media, apparatus and other embodiments associated with performing comma alignment with scrambled data are described. One example method includes controlling an apparatus to generate a data stream that facilitates achieving and determining alignment in a device. The data stream includes sequences of N random portions of Y-bit characters followed by a Z-bit alignment character, N, Y and Z being integers. Another example method includes controlling an apparatus to receive and examine the data stream. The method also includes generating an alignment signal upon determining an alignment for recovered data in the device.

17 Claims, 9 Drawing Sheets

COMMA ALIGNMENT WITH SCRAMBLED DATA

BACKGROUND

A serializer/deserializer (SERDES) equipped with a decision feedback based equalizer (DFE) requires scrambled, random data to effectively train the DFE taps. However, circuits and/or logics that accept recovered data from a SERDES have a conflicting requirement. The circuits and/or logics that accept recovered data require a predictable pattern (e.g., alignment character, comma character) at some interval to align recovered data to a known boundary. Balancing these requirements leads to compromises in speed, randomness, and other factors. In some cases, the compromises may be unacceptable.

One conventional approach known as 8b10b encoding uses the K28.4 "comma" character to align the SERDES data to a known boundary. Other conventional approaches continuously transmit a fixed 10-bit value until link align circuits and/or logics complete bit alignment. Continuously transmitting a fixed bit pattern is the exact opposite of transmitting scrambled, random data. Another conventional approach known as 64/66 continuously sends 64 bits of scrambled data followed by a known 2-bit pattern (e.g., 10, 01) until alignment is achieved. However, it is very likely that the 2-bit alignment pattern will also appear in the 64 bits of scrambled data. Therefore, aligning to the known 2-bit pattern can be time consuming as many erroneous 2-bit patterns may be recognized during alignment.

SUMMARY

One embodiment of the disclosure includes a computer-readable storage medium containing a program which, when executed, performs an operation. The operation may include generating a data stream that facilitates achieving alignment. The data stream may include sequences of: (i) N random portions of Y-bit characters and (ii) a Z-bit alignment character, N, Y, and Z being integers, wherein one or more of N, Y and Z are configurable.

Another embodiment of the disclosure includes a computer-readable storage medium containing a program which, when executed, performs an operation. The operation may include examining a received data stream that facilitates determining alignment in a device. The data stream may include sequences of: (i) N random portions of Y-bit characters and (ii) a Z-bit alignment character, N, Y and Z being integers, wherein one or more of N, Y and Z are configurable. The operation may also include generating an alignment signal upon determining an alignment for recovered data in the device.

Yet another embodiment of the disclosure includes an apparatus that may include a data stream monitor and an alignment logic. The data stream monitor may be configured to recover data from a data stream provided to a first device. The data stream may include sequences of: (i) N random portions of Y-bit characters followed by (ii) a Z-bit alignment character, N, Y and Z being integers, wherein the data stream monitor is dynamically adaptable to recover data as N varies while Y and Z remain fixed. The alignment logic may be configured to determine when the first device achieves alignment in the data recovered by the data stream monitor Still another embodiment of the disclosure includes a computer-implemented method that may include generating a data stream that facilitates achieving alignment. The data stream may include sequences of: (i) N random portions of Y-bit characters and (ii) a Z-bit alignment character, N, Y and Z being integers, wherein one or more of N, Y and Z are configurable.

BRIEF DESCRIPTION OF THE DRAWINGS

The accompanying drawings, which are incorporated in and constitute a part of the specification, illustrate various example systems, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DESCRIPTION OF EXAMPLE EMBODIMENTS

Overview

Figure 1:
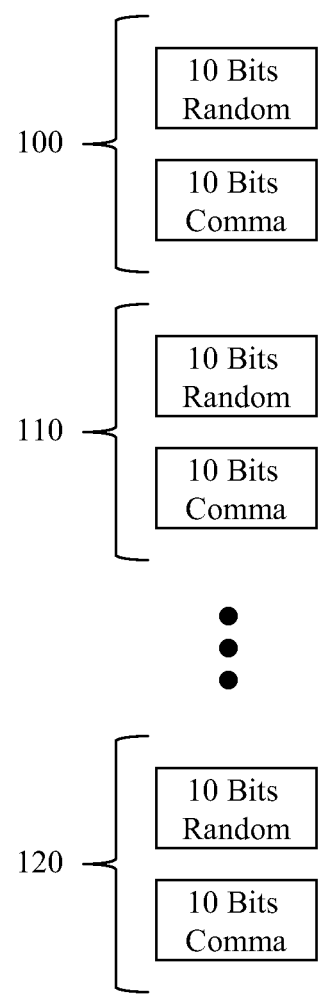
FIG. 1 illustrates a data stream that includes a 10-bit random portion and a 10-bit alignment character, according to one embodiment of the disclosure.

Example embodiments generate a data stream that is examined to determine SERDES alignment. The data stream includes repetitions of a two part sequence. The two part sequence includes a random portion and an alignment character. The alignment character may be, for example, a 10-bit "comma" character. In this example, the two part sequence will include a 10-bit comma character interspersed with N 10-bit random characters. In one embodiment, N may be any positive integer. N may also be selected from a predefined range of values set by a user (e.g., an administrator). Because the N 10-bit characters are random, it is possible that one of the N 10-bit random characters could appear to be the 10-bit alignment character. If this happens, the one of the 1–N 10-bit random characters (appearing to be the alignment character) is replaced with a different random value. In one example, the alignment character is incremented to produce the new random value.

The alignment character should only be present in the expected bit alignment in the same N relationship. However, it is possible that 10-bits of random characters—that are not aligned with any of the 1–N 10-bit random characters—could appear as the 10-bit comma character in the data stream. For example, the last five bits of one character and the first five bits of the next character could form the 10-bit comma character. However, with a 10-bit character this is unlikely. It is even more unlikely that the same pattern would be present in two consecutive instances of the sequence in the data stream. Furthermore, the degree of likelihood is determinable, which facilitates quickly dropping false positives. In the 64/66 scheme, the likelihood of a false positive is much higher (e.g., 50/50). Additionally, the likelihood of the false positive appearing in the same location in a sequence is much higher than in the 10-bit scheme. Using a 10-bit alignment character with N characters of random data, the odds of seeing three false positives are 1 in a thousand ($1 \times 10^3$).

One example embodiment identifies the 10-bit "comma" character, aligns to the 10-bit "comma" character and then starts a counter. The counter is incremented each time the example embodiment sees a repetition of the 10-bit "comma" character in the same position in a sequence. Once an interval is established, the example embodiment looks for X consecutive N intervals of random content followed by the 10-bit "comma" character. Once X consecutive intervals have been identified, the example embodiment signals that alignment is complete. If the relationship between the N intervals and the 10-bit comma character is violated, alignment begins anew. X and N are integers. In one embodiment, both X and N may be configurable.

Example embodiments transmit a 10-bit comma character followed by a configurable, predictable number of scrambled characters. Example embodiments therefore facilitate quickly finding the bit alignment for SERDES recovered data. This strikes a useful balance that facilitates a DFE based SERDES to train properly while still providing sufficient predictability for bit alignment. Example embodiments therefore facilitate reusing some existing comma detect circuits. Because the values of N and X are user configurable, tradeoff decisions that balance convergence speed against content randomness can be made.

Description

The basic problemOne challenge in processing data recovered from a SERDES is bit alignment. A circuit and/or logic receives data aligned with a clock, but the alignment is arbitrary. Therefore, to be able to faithfully reconstruct the recovered data, the proper alignment of the data with the clock is required. Example embodiments provide a special character mixed in with a configurable amount of random, scrambled data in a data stream that facilitates determining the alignment. During an alignment phase, which is also referred to as a "syncing" phase, a receiver logic is programmed to constantly look for the special character.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

One embodiment of the disclosure is implemented as a program product for use with a computer system. The program(s) of the program product defines functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive) on which information is permanently stored; (ii) writable storage media (e.g., floppy disks within a diskette drive or hard-disk drive) on which alterable information is stored. Such computer-readable storage media, when carrying computer-readable instructions that direct the functions of the present disclosure, are embodiments of the present disclosure. Other media include communications media through which information is conveyed to a computer, such as through a computer or telephone network, including wireless communications networks. The latter embodiment specifically includes transmitting information to/from the Internet and other networks. Such communications media, when carrying computer-readable instructions that direct the functions of the present disclosure, are embodiments of the present disclosure. Broadly, computer-readable storage media and communications media may be referred to herein as computer-readable media.

In general, the routines executed to implement the embodiments of the disclosure, may be part of an operating system or a specific application, component, program, module, object or sequence of instructions. The computer program of the present disclosure typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the disclosure. However, it should be appreciated that any particular program nomenclature that follows is used merely for convenience, and thus the disclosure should not be limited to use solely in any specific application identified and/or implied by such nomenclature.

Figure 2:
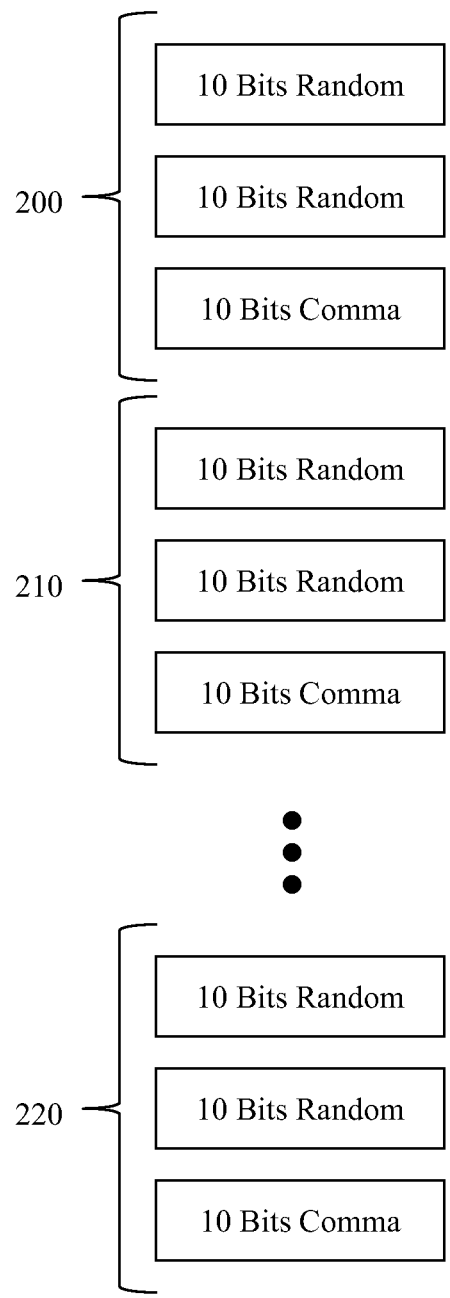
FIG. 2 illustrates a data stream that includes two 10-bit random portions and a 10-bit alignment character, according to one embodiment of the disclosure.
Figure 3:
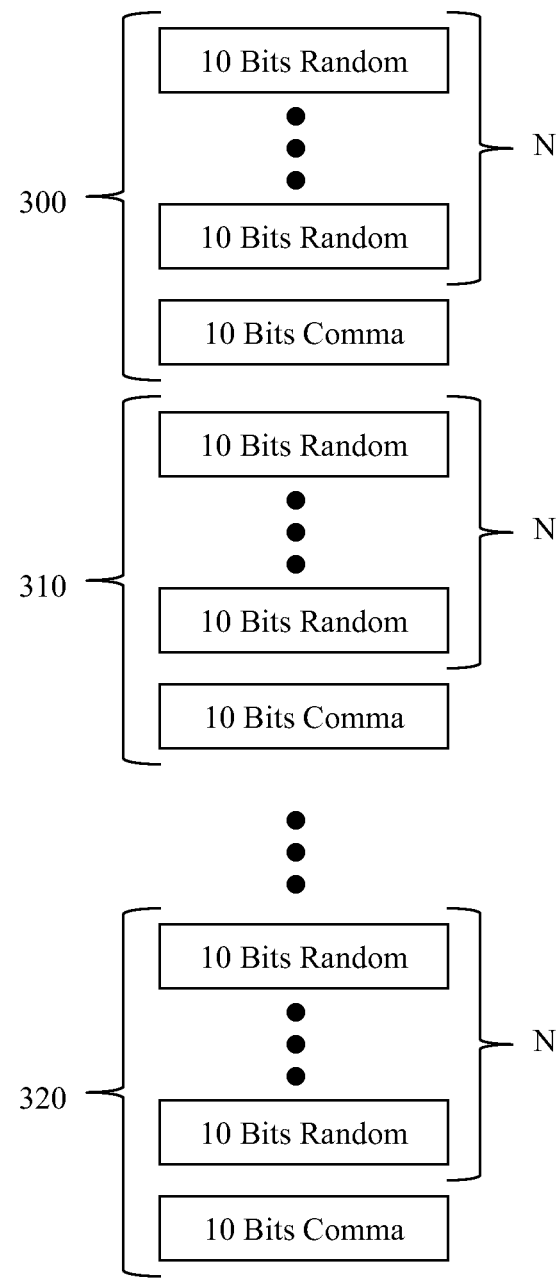
FIG. 3 illustrates a data stream that includes N 10-bit random portions and a 10-bit alignment character, where N is an integer, and where N is configurable, according to one embodiment of the disclosure.
Figure 4:
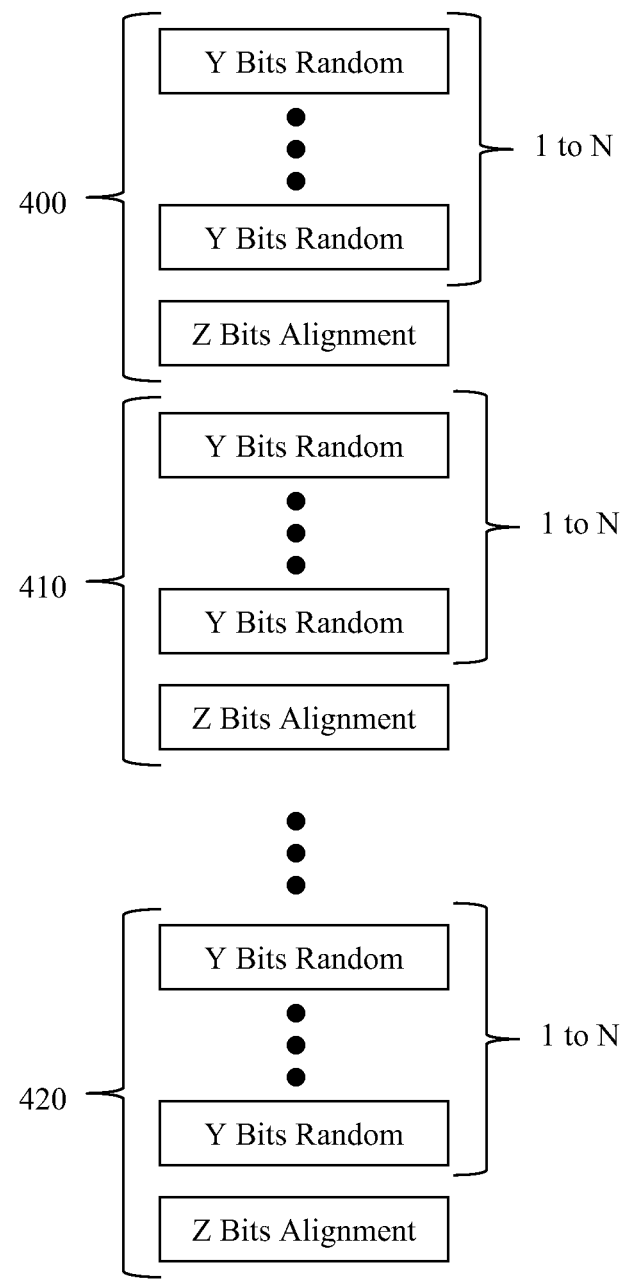
FIG. 4 illustrates a data stream that includes N Y-bit random portions and a Z-bit alignment character, according to one embodiment of the disclosure.

FIG. 1 illustrates a data stream that includes a set of two part sequences. The two part sequences include a 10-bit random portion and a 10-bit alignment character. For example, two part sequence 100 includes 10 bits of random data followed by 10 bits that represent a comma character. To facilitate determining alignment, the data stream repeatedly provides two part sequences. Therefore, FIG. 1 illustrates a two part sequence 100 followed by a two part sequence 110 followed by a two part sequence 120. A number of two part sequences could be provided between two part sequence 110 and two part sequence 120. One of ordinary skill in the art will appreciate from the teachings herein that a data stream may include different two part sequences and may include random portions having more or less bits and may include an alignment character having more or less bits. FIGS. 2, 3 and 4 illustrate other example data streams.

FIG. 2 illustrates a data stream that includes a set of three part sequences. The three part sequences include two 10-bit random portions and a 10-bit alignment character. For example, three part sequence 200 includes two 10-bit random portions followed by 10 bits that represent a comma character. Similarly, three part sequence 210 includes two 10-bit random portions followed by 10 bits that represent a comma character and three part sequence 220 includes two 10-bit random portions followed by 10 bits that represent a comma character. The data stream may be generated until alignment is determined.

FIG. 3 illustrates a data stream that includes a set of sequences having N 10-bit random portions and a 10-bit alignment character. In one embodiment, N is an integer and is configurable. The data stream in FIG. 3 includes an N+1 part sequence 300. Sequence 300 includes N 10-bit random portions followed by 10 bits that represent a comma character. The data stream also includes N+1 part sequence 310 and N+1 part sequence 320. A SERDES that was trying to determine alignment could be programmed to expect the N random portions and then to expect the 10 bit comma portions. A SERDES that was trying to determine alignment could be programmed to assert that alignment had been achieved after detecting the 10-bit comma portions in the exact same locations in a user configurable number of consecutive repeating sequences. "User," as used herein, includes but is not limited to one or more persons, software, logics, computers or other devices, or combinations of these.

FIG. 4 illustrates a more general data stream that can be generated and examined to determine alignment for a DFE-equipped SERDES. The data stream includes repeating sequences of N Y-bit random portions and a Z-bit alignment character. For example, sequence 400 includes N Y-bit random portions followed by Z bits that represent an alignment character. Similarly, sequence 410 includes N Y-bit bit random portions followed by Z bits that represent an alignment character and sequence 420 includes N Y-bit random portions followed by Z bits that represent an alignment character.

Figure 5:
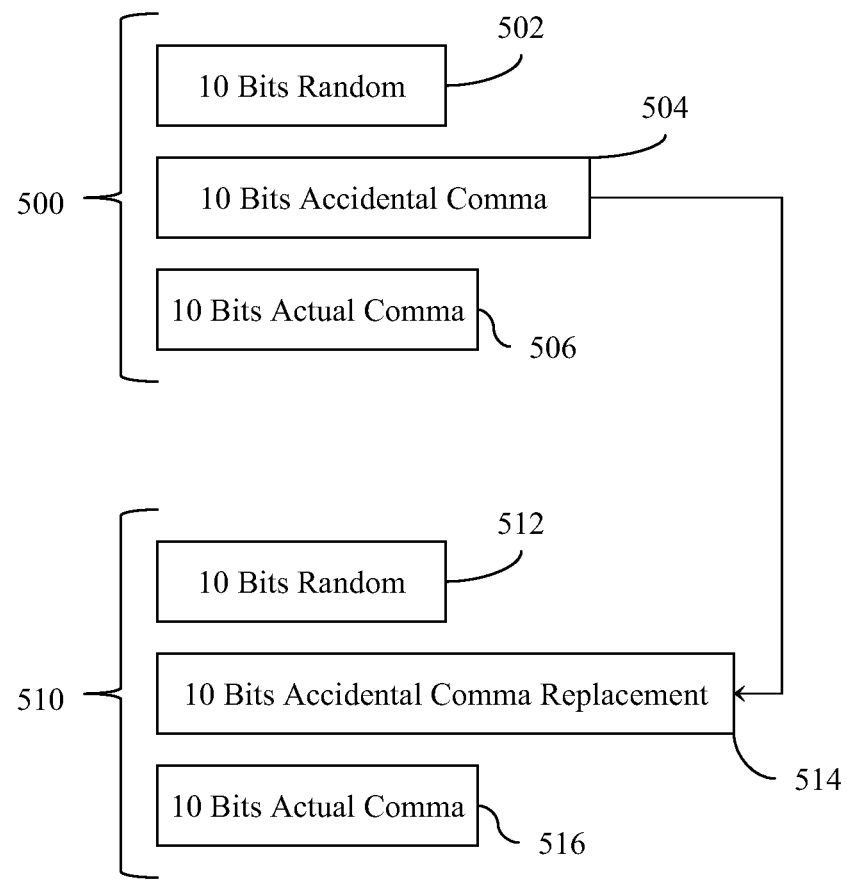
FIG. 5 illustrates a data stream in which an alignment character initially appearing in the random portion was replaced by a different bit pattern, according to one embodiment of the disclosure.

FIG. 5 illustrates a data stream in which an alignment character initially appearing in the random portion is replaced by a different bit pattern to avoid having the alignment character appear in the random portion. Sequence 500 includes a 10-bit random portion 502 that is not the comma character, a 10-bit portion 504 coincidentally (accidentally) appearing as the comma character, and a 10-bit portion 506 that was intentionally the comma character. If 10-bit portion 504 was provided in a data stream used for DFE-equipped SERDES alignment, then a false positive could occur. Therefore, embodiments described herein can be configured to replace a coincidentally occurring comma character like 10-bit portion 504. In one example, sequence 500 would be edited to produce sequence 510 before being provided in a data stream. Sequence 510 includes a 10-bit random portion 512 that corresponds to 10-bit random portion 502 and a 10-bit comma character 516 that corresponds to 10-bit comma character 506. However, the coincidental comma 504 has been replaced with 10 bits that are different from the comma character in portion 514. In one example, when a coincidental comma character is detected, the replacement 10-bit portion can be produced by incrementing the coincidental comma character.

Figure 6:
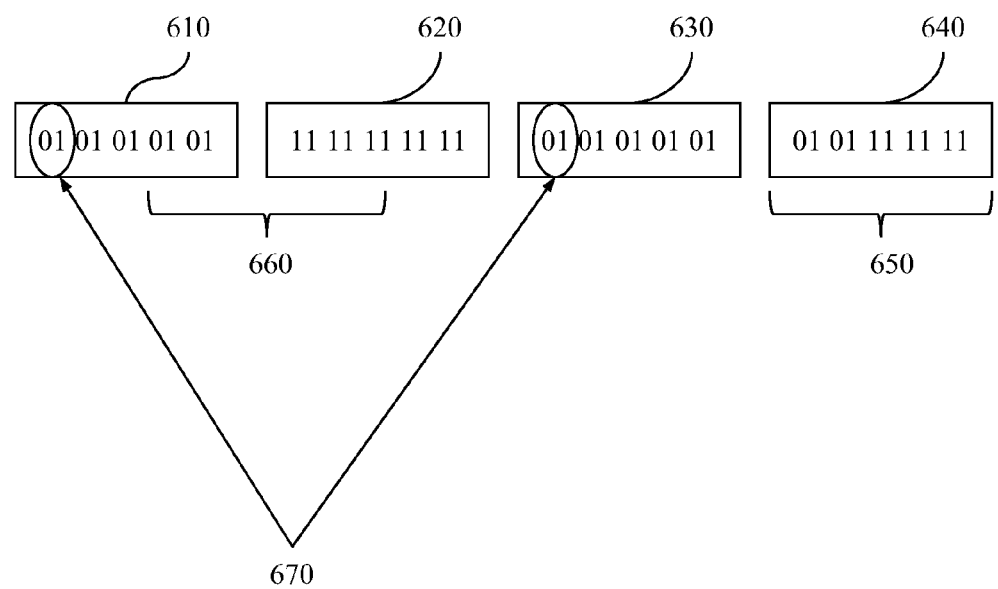
FIG. 6 illustrates a data stream in which an alignment character overlaps between two 10-bit portions of a random portion of the data stream, according to one embodiment of the disclosure.

Coincidental comma characters that may generate false positives can also appear in a data stream in other ways. FIG. 6 illustrates a data stream in which an unintentional alignment character overlaps between two 10-bit portions of a random portion of the data stream. The data stream includes a 10-bit random portion 610, a 10-bit random portion 620, a 10-bit random portion 630 and a 10-bit alignment character 640. The 10-bit alignment character can also be referred to as an intentional comma 650. Comparing the streams of bits in the data stream reveals that a 10-bit sequence 660 represents an unintentional comma character that could generate a false positive. The likelihood of a single false positive occurring in a data stream produced by embodiments described herein is much less than in conventional systems. Consider if the alignment character was a 2-bit character as in some conventional systems. Two-bit patterns 670 reveal just a few of the false positives that could be generated in a data stream. Compare the likelihood of the unintentional comma 660 appearing at the exact same location in a next sequence against the likelihood of either of the unintentional 2-bit alignment characters 670 appearing at the exact same location in a next sequence. The comparison reveals that data streams produced by embodiments described herein will produce substantially fewer false positives, which facilitates faster and more accurate alignment.

Figure 7:
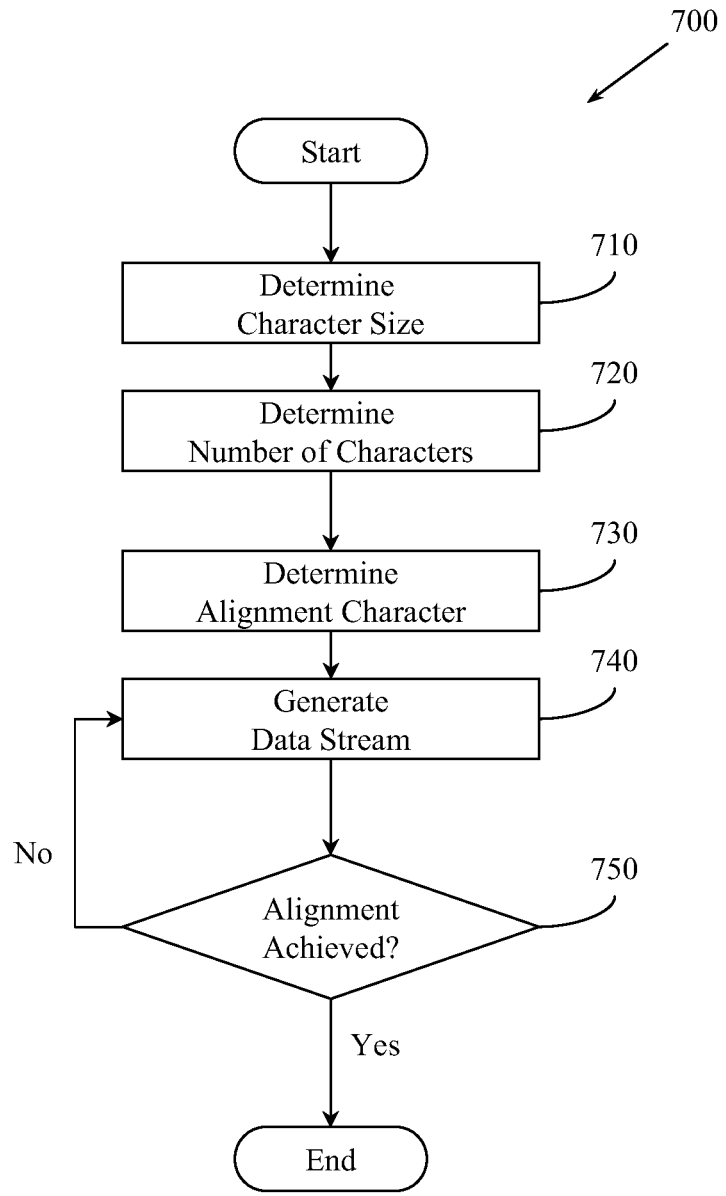
FIG. 7 illustrates a method associated with providing a data stream that includes a random portion and an alignment character, according to one embodiment of the disclosure.

FIG. 7 illustrates a method 700 associated with providing a data stream for use by a DFE-equipped SERDES. Method 700 includes, at step 710, determining a character size (e.g., Y, where Y is an integer) for characters that will appear in the random portion of sequences. In one embodiment, the character size can be user-configurable. In another embodiment, the character size may be determined as a function of the type of DFE-equipped SERDES to which the data stream is to be provided.

Method 700 also includes, at step 720, determining the number of random characters (e.g., N, where N is an integer) that will appear in the sequences in the data stream. In one example, the number of characters may be user configurable to facilitate balancing alignment speed against other factors. In another example, the number of characters may be determined as a function of the type of DFE-equipped SERDES to which the data stream is to be provided.

Method 700 also includes, at step 730, determining the size (e.g., Z, where Z is an integer) and/or identity of an alignment character. In one example, the size of the alignment character may be user configurable while in another example the size may be determined as a function of the type of DFE-equipped SERDES to which the data stream is to be provided. Similarly, the actual alignment character may be user selected and/or may be automatically selected as a function of the receiving equipment.

Method 700 also includes, at step 740, generating the data stream. The data stream will include repeating sequences of data like those described in connection with FIGS. 1 through 4. While the term "repeating sequence" is employed, one skilled in the art will appreciate that the random portions can be newly random in different sequences.

In one embodiment, method 700 will continue to provide the data stream until it is determined that the DFE-equipped SERDES has achieved alignment. Thus, method 700 may, at step 750, determine whether alignment has been achieved. If alignment has been achieved, then method 700 may conclude, otherwise method 700 may continue to generate the data stream. In another embodiment, method 700 may provide the data stream for up to a threshold amount of time or up to a threshold number of characters.

While FIG. 7 illustrates various actions occurring in serial, it is to be appreciated that various actions illustrated in FIG. 7 could occur substantially in parallel. By way of illustration, a first process could determine character size, number of characters, and alignment character while a second process could generate a data stream and a third process could monitor whether alignment has been achieved. While three processes are described, it is to be appreciated that a greater and/or lesser number of processes could be employed and that lightweight processes, regular processes, threads and other approaches could be employed.

Figure 8:
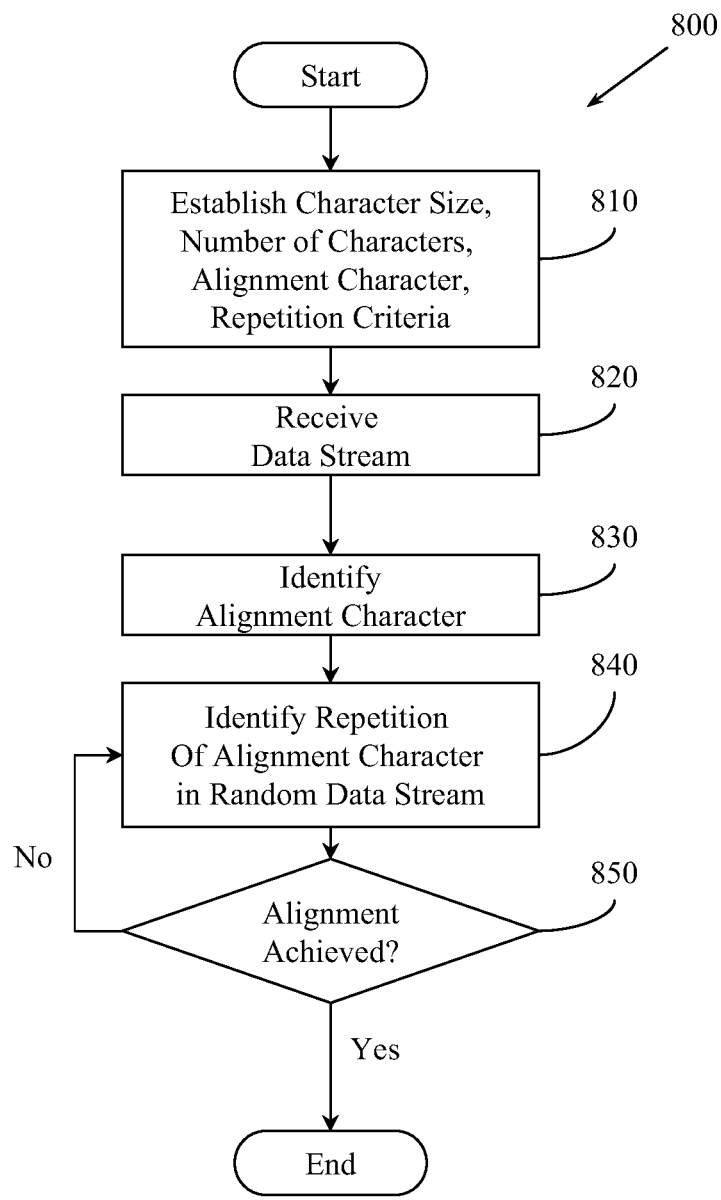
FIG. 8 illustrates a method associated with determining alignment based on examining a data stream that has a random portion and an alignment character, according to one embodiment of the disclosure.

FIG. 8 illustrates a method 800 associated with receiving a data stream for use by a DFE-equipped SERDES to establish alignment. Method 800 includes, at step 810, establishing a character size for characters that will appear in the random portion of repeating sequences, establishing a number of characters that will appear in the random portion of repeating sequences, establishing an alignment character, and establishing repetition criteria that determine when alignment is deemed to have been achieved. In different embodiments, the character size, number of characters, alignment character and/or repetition criteria can be user-configurable. In another embodiment, the character size, number of characters, alignment character, and/or repetition criteria may be determined as a function of the type of DFE-equipped SERDES to which the data stream is to be provided. The character size, number of characters, alignment character, and/or repetition criteria may be provided to method 800 from another process (e.g., method 700 (FIG. 7)).

Once configured, method 800 continues, at step 820, by receiving a data stream. The data stream will be monitored to identify the repeating sequences and to look for alignment characters hopefully appearing repeatedly in the same location in the data stream. Therefore method 800 includes, at step 830, identifying an alignment character in the data stream. Since there is some possibility of a false positive, simply identifying one alignment character is not sufficient to determine alignment. Instead, an alignment character needs to be seen in the same spot, in the proper ratio with respect to the random sequences, before alignment can be determined. Therefore method 800 includes, at step 840, identifying repeats of the alignment character in the data stream. At step 850, a determination is made concerning whether alignment has been achieved. If so, then alignment may be signaled to other processes (e.g., method 700 (FIG. 7)). If not, then method 800 may continue to search for and identify alignment characters.

Method 800 may determine that alignment has occurred after identifying the alignment character in the appropriate location in the data stream X consecutive times. In one example, X can be a user configurable number, while in another example X can be a number associated with the type of DFE-equipped SERDES being aligned.

Figure 9:
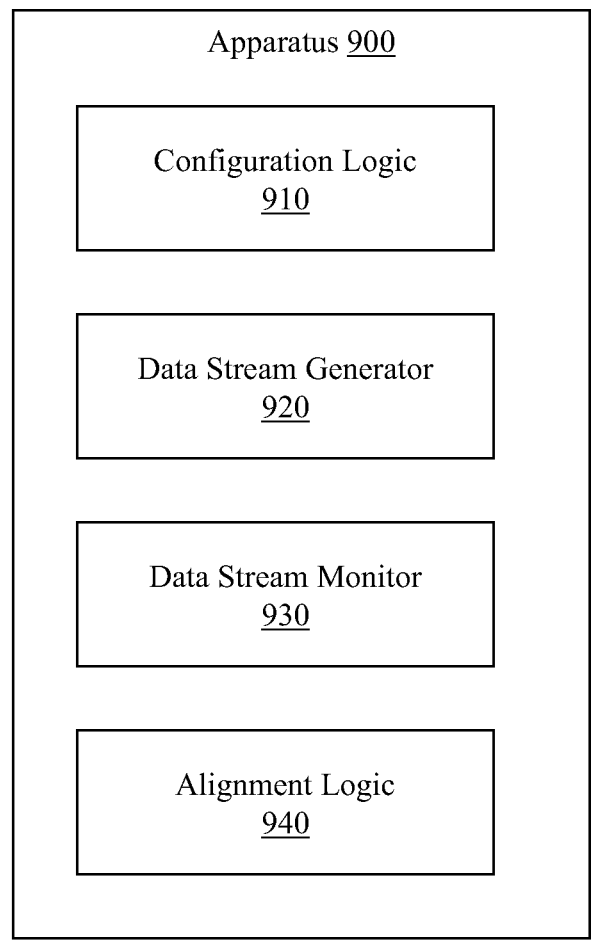
FIG. 9 illustrates an apparatus configured to process a data stream having a random portion and a periodically appearing alignment character, according to one embodiment of the disclosure.

FIG. 9 illustrates an apparatus 900. Apparatus 900 is configured to process a data stream having a random portion and a periodically appearing alignment character. Apparatus 900 may form part of a DFE-equipped SERDES.

In one embodiment, apparatus 900 includes an alignment logic 940 that is configured to determine whether a DFE-equipped SERDES has achieved alignment. Alignment may be determined by identifying a threshold number of alignment characters appearing in appropriate locations in a data stream. In one embodiment, apparatus 900 also includes a data stream monitor 930 that is configured to examine an alignment-oriented data stream. The alignment-oriented data stream may resemble those described in FIGS. 1 through 4, for example. Thus, the data stream monitor 930 may look for repeating sequences that include random portions and an alignment character. Further, the data stream monitor 930 may dynamically adapt to recover data as N varies while Y and Z remain fixed. For example, the data stream may be monitored to identify an interval at which the alignment character repeats. The data stream monitor 930 may determine N from the identified interval. For example, if $Z=10$, $Y=10$, and Z is observed once out of every 50 bits, then the data stream monitor 930 may determine that $N=(50-10)/10=4$. In one embodiment, the data stream monitor 930 may identify the interval by identifying a threshold number of intervals appearing in appropriate locations in a data stream. The data stream monitor 930 may also be configured by a user (e.g., an administrator) to examine the data stream using a predefined list of possible values for N (e.g., N ranging from 4 to 6).

In one embodiment, apparatus 900 also includes a data stream generator 920 that is configured to produce and provide an alignment-oriented data stream. The alignment-oriented data stream may resemble those described in FIGS. 1 through 4, for example. The data stream generator 920 may be configured to selectively replace alignment characters that coincidentally appear in a random portion of a repeating sequence.

In one embodiment, apparatus 900 also includes a configuration logic 910 that is configured to establish values for configurable attributes of an alignment-oriented data stream. The configurable attributes can include, but are not limited to, random character size, alignment character size, number of random characters in a repeating sequence, identity of alignment character and number of consecutive alignment characters that determine alignment. The configurable attributes may be configured by a user, may be configured as a function of the DFE-equipped SERDES for which alignment is sought, and on other attributes. One skilled in the art will appreciate that in one embodiment apparatus 900 could be implemented in an application specific integrated circuit (ASIC). "Logic," as used herein, includes but is not limited to hardware, firmware, software in execution on a machine, and/or combinations of each to perform a function(s) or an action(s), and/or to cause a function or action from another logic, method and/or system. Logic may include a software controlled microprocessor, a discrete logic (e.g., ASIC), an analog circuit, a digital circuit, a programmed logic device, and a memory device containing instructions may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

Of course, the embodiments described herein are intended to be illustrative and not limiting of the disclosure, and other embodiments are broadly contemplated. For example, while embodiments are described in conjunction with the DFE-equipped SERDES, those skilled in the art will recognize that embodiments of the disclosure may be adapted to support any asynchronous communication generally in which a data stream is aligned to a foreign clock (e.g., video synchronization, serial communication such as satellite communication, etc.).

While the foregoing is directed to embodiments of the present disclosure, other and further embodiments of the disclosure may be devised without departing from the basic scope thereof, and the scope thereof is determined by the claims that follow.

The invention claimed is:

1. A non-transitory computer-readable medium containing a program which, when executed, performs an operation comprising:

generating, by operation of one or more computer processors when executing the program, a data stream that facilitates achieving alignment, wherein the data stream comprises sequences of: (i) N random portions of Y-bit characters and (ii) a Z-bit alignment character, N, Y, and Z being integers, wherein one or more of N, Y and Z are configurable; and replacing an alignment character that appears in the N random portions with a non-alignment character.

2. The non-transitory computer-readable medium of claim 1, wherein the operation further comprises:
continuing to generate the data stream until alignment is achieved or until a threshold amount of data has been generated.

3. The non-transitory computer-readable medium of claim 1, wherein the data stream facilitates achieving alignment in a serializer/deserializer (SERDERS) equipped with a decision feedback based equalizer (DFE).

4. The non-transitory computer-readable medium of claim 3, wherein one or more of N, Y and Z are one or more of, user-configurable, and configurable as a function of an attribute of the SERDES to which the data stream is provided.

5. A non-transitory computer-readable medium containing a program which, when executed, performs an operation comprising:
examining, by operation of one or more computer processors when executing the program, a received data stream that facilitates determining alignment in a device, wherein the data stream comprises sequences of: (i) N random portions of Y-bit characters and (ii) a Z-bit alignment character, N, Y and Z being integers, wherein one or more of N, Y and Z are configurable, and wherein an alignment character that appears in the N random portions is replaced with a non-alignment character; and
generating an alignment signal upon determining an alignment for recovered data in the device.

6. The non-transitory computer-readable medium of claim 5, wherein one or more of N, Y and Z are one or more of, user-configurable, and configurable as a function of the device.

7. The non-transitory computer-readable medium of claim 5, wherein the device comprises a serializer/deserializer (SERDERS) equipped with a decision feedback based equalizer (DFE).

8. The non-transitory computer-readable medium of claim 5, wherein determining an alignment for recovered data in the device comprises:
detecting a properly positioned alignment character in X consecutive sequences in the data stream without detecting an improperly positioned alignment character in the data stream, X being an integer.

9. An apparatus, comprising:
a data stream monitor configured to recover data from a data stream provided to a first device, wherein the data stream comprises sequences of: (i) N random portions of Y-bit characters followed by (ii) a Z-bit alignment character, N, Y and Z being integers, wherein the data stream monitor is dynamically adaptable to recover data as N varies while Y and Z remain fixed;
a data stream generator configured to provide the data stream, wherein the data stream generator is configured to replace an alignment character that appears in the N random portions with a non-alignment character; and
an alignment logic configured to determine when the first device achieves alignment in the data recovered by the data stream monitor.

10. The apparatus of claim 9, wherein the alignment logic is further configured to determine that the first device has achieved alignment in the data recovered by the data stream monitor upon detecting a properly positioned alignment character in X consecutive sequences in the data stream without detecting an improperly positioned alignment character in the data stream, X being an integer.

11. The apparatus of claim 9, wherein the alignment logic is further configured to control a second device to stop providing the data stream upon determining that the first device has achieved alignment in the data recovered by the data stream monitor.

12. The apparatus of claim 9, wherein the first device comprises a serializer/deserializer (SERDES) equipped with a decision feedback based equalizer (DFE).

13. The apparatus of claim 9, further comprising a data stream generator configured to provide the data stream, wherein the data stream generator is configured to generate the data stream until alignment is achieved or until a threshold amount of data has been generated.

14. The apparatus of claim 9, further comprising:
a configuration logic configured to adjust one or more of X, Y, Z, N and an identity of the alignment character based on at least one of a user input and an attribute of the first device.

15. A computer-implemented method, comprising:
generating, by operation of one or more computer processors, a data stream that facilitates achieving alignment, wherein the data stream comprises sequences of: (i) N random portions of Y-bit characters and (ii) a Z-bit alignment character, N, Y and Z being integers, wherein one or more of N, Y and Z are configurable; and
replacing an alignment character that appears in the N random portions with a non-alignment character.

16. The computer-implemented method of claim 15, wherein the data stream facilitates achieving alignment in an asynchronous communication device.

17. The computer-implemented method of claim 15, wherein the data stream facilitates achieving alignment in a serializer/deserializer (SERDERS) equipped with a decision feedback based equalizer (DFE).

* * * * *